(12) United States Patent
Gellineau

(10) Patent No.: US 11,519,869 B2
(45) Date of Patent: Dec. 6, 2022

(54) METHODS AND SYSTEMS FOR REAL TIME MEASUREMENT CONTROL

(71) Applicant: KLA-Tencor Corporation, Milpitas, CA (US)

(72) Inventor: Antonio Arion Gellineau, Santa Clara, CA (US)

(73) Assignee: KLA Tencor Corporation, Milpitas, CA (US)

( * ) Notice: Subject to any disclaimer, the term of this patent is extended or adjusted under 35 U.S.C. 154(b) by 0 days.

(21) Appl. No.: 16/278,078

(22) Filed: Feb. 16, 2019

(65) Prior Publication Data
US 2019/0293578 A1    Sep. 26, 2019

Related U.S. Application Data

(60) Provisional application No. 62/645,721, filed on Mar. 20, 2018.

(51) Int. Cl.
*G01N 23/201* (2018.01)
*G01N 23/2055* (2018.01)
*G03F 7/20* (2006.01)

(52) U.S. Cl.
CPC ....... *G01N 23/201* (2013.01); *G01N 23/2055* (2013.01); *G03F 7/7065* (2013.01);
(Continued)

(58) Field of Classification Search
CPC ....... G01N 23/2055; G01N 2223/1016; G01N 2223/6116; G03F 7/70616
(Continued)

(56) References Cited

U.S. PATENT DOCUMENTS 5,608,526 A    3/1997 Piwonka-Corle et al.
5,859,424 A    1/1999 Norton et al.
(Continued)

FOREIGN PATENT DOCUMENTS

WO    2018024446 A1    2/2018

OTHER PUBLICATIONS

International Search Report dated Jun. 28, 2019 , for PCT Application No. PCT/US2019/022839 filed on Mar. 19, 2019 by KLA-Tencor Corporation, 3 pages.
(Continued)

*Primary Examiner* — Thomas R Artman
(74) *Attorney, Agent, or Firm* — Spano Law Group; Joseph S. Spano

(57) ABSTRACT

Methods and systems for improving a measurement recipe describing a sequence of measurements employed to characterize semiconductor structures are described herein. A measurement recipe is repeatedly updated before a queue of measurements defined by the previous measurement recipe is fully executed. In some examples, an improved measurement recipe identifies a minimum set of measurement options that increases wafer throughput while meeting measurement uncertainty requirements. In some examples, measurement recipe optimization is controlled to trade off measurement robustness and measurement time. This enables flexibility in the case of outliers and process excursions. In some examples, measurement recipe optimization is controlled to minimize any combination of measurement uncertainty, measurement time, move time, and target dose. In some examples, a measurement recipe is updated while measurement data is being collected. In some examples, a measurement recipe is updated at a site while data is collected at another site.

18 Claims, 10 Drawing Sheets

(52) U.S. Cl.
CPC ...... *G03F 7/70616* (2013.01); *G03F 7/70625* (2013.01); *G01N 2223/054* (2013.01); *G01N 2223/1016* (2013.01); *G01N 2223/303* (2013.01); *G01N 2223/304* (2013.01); *G01N 2223/305* (2013.01); *G01N 2223/306* (2013.01); *G01N 2223/6116* (2013.01); *G01N 2223/645* (2013.01)

(58) Field of Classification Search
USPC .......................................................... 378/46
See application file for complete search history.

(56) References Cited

U.S. PATENT DOCUMENTS

| | | | |
|---|---|---|---|
| 6,429,943 | B1 | 8/2002 | Opsal et al. |
| 6,633,831 | B2 | 10/2003 | Nikoonahad et al. |
| 6,734,967 | B1 | 5/2004 | Piwonka-Corle et al. |
| 6,816,570 | B2 | 10/2004 | Janik et al. |
| 6,895,075 | B2 | 5/2005 | Yokhin et al. |
| 6,972,852 | B2 * | 12/2005 | Opsal ................ G01B 11/02 356/625 |
| 7,478,019 | B2 | 1/2009 | Zangooie et al. |
| 7,526,354 | B2 * | 4/2009 | Madriaga ............ G01B 11/14 700/98 |
| 7,755,764 | B2 | 7/2010 | Kwak et al. |
| 7,826,071 | B2 * | 11/2010 | Shchegrov ........... G01N 21/211 356/625 |
| 7,907,264 | B1 | 3/2011 | Krishnan |
| 7,929,667 | B1 | 4/2011 | Zhuang et al. |
| 7,933,026 | B2 | 4/2011 | Opsal et al. |
| 8,860,937 | B1 | 10/2014 | Dziura et al. |
| 9,528,946 | B2 * | 12/2016 | Turovets ............ G01N 21/8903 |
| 9,826,614 | B1 * | 11/2017 | Bakeman .................. G21K 7/00 |
| 9,915,522 | B1 | 3/2018 | Jiang et al. |
| 9,915,624 | B2 * | 3/2018 | Turovets ................ G01N 21/47 |
| 10,146,140 | B2 * | 12/2018 | Pisarenco ................ G03F 7/705 |
| 10,197,506 | B2 * | 2/2019 | Turovets ................ G01B 11/24 |
| 10,203,200 | B2 * | 2/2019 | Marciano ............. G01B 11/272 |
| 10,255,385 | B2 * | 4/2019 | Pandev ................... G03F 7/705 |
| 10,324,050 | B2 * | 6/2019 | Hench .............. G01N 23/20008 |
| 2001/0042068 | A1 * | 11/2001 | Yoshida ............... G05B 19/401 |
| 2008/0009081 | A1 | 1/2008 | Madriaga et al. |
| 2013/0114085 | A1 | 5/2013 | Wang et al. |
| 2013/0304424 | A1 | 11/2013 | Bakeman et al. |
| 2014/0019097 | A1 | 1/2014 | Bakeman et al. |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2014/0297211 | A1 | 10/2014 | Pandev et al. |
| 2014/0316730 | A1 | 10/2014 | Shchegrov et al. |
| 2015/0042984 | A1 | 2/2015 | Pandev et al. |
| 2015/0046118 | A1 | 2/2015 | Pandev et al. |
| 2015/0110249 | A1 | 4/2015 | Bakeman et al. |
| 2015/0117610 | A1 | 4/2015 | Veldman et al. |
| 2015/0204664 | A1 | 7/2015 | Bringoltz et al. |
| 2015/0226680 | A1 * | 8/2015 | Turovets ............ G01N 21/9501 356/237.5 |
| 2015/0300965 | A1 * | 10/2015 | Sezginer ............... G01N 23/201 378/86 |
| 2016/0202193 | A1 * | 7/2016 | Hench .............. G01N 23/20008 702/85 |
| 2016/0223476 | A1 * | 8/2016 | Quintanilha ........ G03F 7/70625 |
| 2016/0320319 | A1 * | 11/2016 | Hench .................. G01N 23/207 |
| 2017/0023491 | A1 | 1/2017 | Cao et al. |
| 2017/0060001 | A1 * | 3/2017 | Adel ...................... H01L 22/30 |
| 2017/0061604 | A1 * | 3/2017 | Pandev ............... G03F 7/70625 |
| 2017/0102623 | A1 * | 4/2017 | Pisarenco ................ G01N 23/201 |
| 2017/0167862 | A1 * | 6/2017 | Dziura .................... G01B 15/02 |
| 2017/0167987 | A1 | 6/2017 | Turovets et al. |
| 2017/0199136 | A1 * | 7/2017 | Krokhmal ............ G01N 23/201 |
| 2017/0200524 | A1 * | 7/2017 | Adler ...................... G21K 7/00 |
| 2017/0315055 | A1 * | 11/2017 | Tinnemans ......... G03F 7/70633 |
| 2017/0357155 | A1 * | 12/2017 | Quintanilha ........... G03F 7/2004 |
| 2018/0106735 | A1 | 4/2018 | Gellineau et al. |
| 2018/0195975 | A1 * | 7/2018 | Turovets ................ G01B 11/24 |
| 2019/0293578 | A1 * | 9/2019 | Gellineau .......... G01N 23/2055 |
| 2020/0025554 | A1 * | 1/2020 | Gellineau ............ G01N 21/211 |

OTHER PUBLICATIONS

Gellineau et al., U.S. Appl. No. 15/362,741, filed Nov. 28, 2016.

* cited by examiner

METHODS AND SYSTEMS FOR REAL TIME MEASUREMENT CONTROL

CROSS REFERENCE TO RELATED APPLICATION

The present application for patent claims priority under 35 U.S.C. § 119 from U.S. provisional patent application Ser. No. 62/645,721, filed Mar. 20, 2018, the subject matter of which is incorporated herein by reference in its entirety. The present application for patent is related to U.S. patent application Ser. No. 15/419,130, filed Jan. 30, 2017, the subject matter of which is incorporated herein by reference in its entirety.

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension (SCD) measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. Optical metrology tools utilizing infrared to visible light can penetrate many layers of translucent materials, but longer wavelengths that provide good depth of penetration do not provide sufficient sensitivity to small anomalies. In addition, the increasing number of parameters required to characterize complex structures (e.g., FinFETs), leads to increasing parameter correlation. As a result, the parameters characterizing the target often cannot be reliably decoupled.

In one example, longer wavelengths (e.g. near infrared) have been employed in an attempt to overcome penetration issues for 3D FLASH devices that utilize polysilicon as one of the alternating materials in the stack. However, the mirror like structure of 3D FLASH intrinsically causes decreasing light intensity as the illumination propagates deeper into the film stack. This causes sensitivity loss and correlation issues at depth. In this scenario, SCD is only able to successfully extract a reduced set of metrology dimensions with high sensitivity and low correlation.

In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response to these challenges, more complex optical metrology tools have been developed. For example, tools with multiple angles of illumination, shorter illumination wavelengths, broader ranges of illumination wavelengths, and more complete information acquisition from reflected signals (e.g., measuring multiple Mueller matrix elements in addition to the more conventional reflectivity or ellipsometric signals) have been developed. In addition, X-Ray scatterometry systems, such as transmission, small angle x-ray scatterometry (T-SAXS) systems, have shown promise to address challenging measurement applications. These X-Ray based scatterometry systems also feature large ranges of illumination angles, broad ranges of illumination wavelengths, etc. Although state of the art optical and X-ray scatterometry systems enable challenging measurement applications, timely measurement recipe generation has emerged as a limiting performance issue.

Measurement recipe optimization is a critical aspect of scatterometry. A measurement recipe identifies the set of measurement system settings (e.g., particular wavelengths, angles of incidence, etc.) employed to estimate a structural parameter of interest (e.g., critical dimension, film thickness, material composition, etc.). Ideally, a measurement recipe should include the minimum number of different measurements required to estimate a parameter of interest to maximize measurement throughput. Modern scatterometry tools offer wide ranges of measurement system parameters (e.g., angles of incidence, wavelengths, etc.). This complicates recipe generation because there are so many different measurement system parameter values available. Moreover, there is limited time to perform useful measurements. Thus, the time required to generate a measurement recipe for a particular measurement application is critical.

The time to generate a measurement recipe is especially critical for measurement technologies that require relatively long periods of time for each measurement. For example, some T-SAXS measurements suffer from low brightness and low scattering cross-sections. Hence, these measurements have long acquisition times. In some examples, the measurement model associated with a T-SAXS measurement is complex and a long compute time is required to solve the model.

Currently, measurement recipe generation begins by identifying a relatively large number of different measurements associated with a particular measurement application, performing all of the measurements, and then generating an improved measurement recipe. For example, a relatively large set of measurements each with different system settings (i.e., different system parameter values) is identified. Measurements of one or more structures are then performed at each of the different prescribed metrology system settings.

The measurement data associated with all of the measurements is collected and analyzed to generate an improved measurement recipe (i.e., a subset or different set of measurements).

This approach is applied iteratively to arrive at a satisfactory measurement recipe. At each iteration, the new set of measurements is applied to another lot of wafers. If a given measurement recipe is inadequate, the improved measurement recipe is applied to the next lot of wafers. As a result, process shifts can trigger long periods (e.g., several weeks) of iterative recipe optimization before the metrology system provides value. For slower tools (e.g., photon starved tools), this approach to recipe optimization creates unacceptable delays.

In some examples, a relatively large number of different measurements associated with a particular measurement application are simulated and a measurement recipe is generated based on a tradeoff between measurement performance and acquisition time. Examples of implementing automatic tradeoffs between performance and acquisition time are described in U.S. patent application Ser. No. 15/362,741, the content of which is incorporated herein by reference in its entirety.

Future metrology applications present challenges for metrology due to increasingly small resolution requirements, multi-parameter correlation, increasingly complex geometric structures including high aspect ratio structures, and increasing use of opaque materials. Improved scatterometry based measurement systems are emerging, but measurement recipe generation limits overall measurement performance, especially for photon starved measurement systems. Thus, methods and systems for improved measurement recipe generation are desired.

SUMMARY

Methods and systems for improved measurement recipe generation to describe a sequence of measurements employed to characterize dimensions and material properties of semiconductor structures are described herein. A metrology tool includes a wide array of measurement options. Measurement performance varies for each measurement option and measurement application. An improved measurement recipe identifies a minimum set of measurement options that increases wafer throughput while meeting measurement uncertainty requirements.

In one aspect, a measurement recipe is rapidly generated to achieve an efficient measurement of a semiconductor structure by repeatedly updating the measurement recipe as measurement data is collected before the queue of measurements defined by the previous measurement recipe are executed. The measurement recipe is repeatedly updated based on newly acquired measurement data until a desired measurement uncertainty is achieved or the maximum allowed measurement time is reached.

In general, rather than collecting data associated with an entire, pre-programmed measurement recipe, measurement data collected from initial measurements is employed to update the measurement recipe to confirm the measurement with a minimum of additional data collection.

Initial measurement data is not generally employed to provide a final estimate of the geometry of a semiconductor structure, rather the initial measurement data is employed to create an updated measurement recipe. The updated measurement recipe may confirm initial estimated parameter values or highlight that initial measurement data is an outlier and further measurements are required.

In some embodiments, measurement recipe optimization is controlled to trade off measurement robustness and measurement time. This enables flexibility in the case of outliers and process excursions.

In some embodiments, measurement recipe optimization is controlled to trade off measurement uncertainty and measurement throughput.

In some embodiments, measurement recipe optimization is controlled to minimize any combination of measurement uncertainty, measurement time, move time, and target dose. In some of these embodiments, measurement recipe optimization is controlled to minimize the sum of measurement time and move time for a sequence of collections.

In some embodiments, the computations required to estimate an updated measurement recipe are longer than the time to collect a measurement data. In these embodiments, a measurement recipe is updated while measurement data is being collected.

In some embodiments, a queue of measurements for each measurement site is updated only when an updated measurement recipe is available. In some embodiments, a measurement recipe is updated for one measurement site while data is collected at another measurement site.

In some embodiments, target dose is considered as part of the measurement recipe optimization. There are many measurement scenarios where extended exposure affects the measurement or device performance at the end of processing. In these examples, the overall dose of energy delivered to the metrology target is considered as part of the measurement recipe optimization.

In general, a measurement recipe is updated iteratively until the final measurement meets the required level of uncertainty or the maximum time allowed for measurement expires.

Measurement recipe optimization as described herein may be performed on any number of different metrology systems, such as, but not limited to, x-ray transmission tools, x-ray reflection tools, infrared transmission tools, etc.

In a further aspect, the measurement quality and performance of the metrology system is controlled based on a measured zero order beam. In some examples, the estimates of measurement quality and performance described hereinbefore are provided as input to a feedback controller. The feedback controller communicates control commands that result in changes in state of one or more elements of the metrology system that improves measurement system quality and performance.

In some examples, the control commands are provided to the illumination source. In response, the electrical state of the illumination source is adjusted to change the scanned spot size and shape, illumination power, spot offsets, incident angles, etc.

In some examples, the control commands are provided to one or more positioning devices that control the location of one or more optical elements of the metrology system. In response, the one or more positioning devices changes a position/orientation of one or more optical elements to adjust the incidence angles, focal distance between the illumination source and illumination optics, beam positioning, location of the beam spot on the optic to minimize the effects of surface roughness, etc.

In a further aspect, x-ray scatterometry measurements are performed over a range of angles of incidence that provide sufficient resolution and depth of penetration to characterize high aspect ratio structures through their entire depth.

The foregoing is a summary and thus contains, by necessity, simplifications, generalizations and omissions of detail;

consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for improved measurement recipe generation to characterize dimensions and material properties of semiconductor structures are described herein. A metrology tool includes a wide array of measurement options. Measurement performance varies for each measurement option and measurement application. An improved measurement recipe identifies a minimum set of measurement options that increases wafer throughput while meeting measurement uncertainty requirements.

Metrology systems and techniques are employed to measure structural and material characteristics associated with different semiconductor fabrication processes. In some examples, optimized measurement recipes are employed for x-ray scatterometry measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM).

An idealized measurement of a semiconductor structure is performed over the complete range of available measurement system settings (e.g., angles of incidence, beam divergence, wavelengths, etc.). Data associated with measurements of a semiconductor structure at each combination of available measurement system settings is collected over relatively long exposure times and analyzed to arrive at an estimated value of a parameter of interest that characterizes the structure under measurement. Such an idealized measurement is impractical with modern scatterometry tools. The time required to perform measurements of a metrology target over the entire breadth of measurement options is impractically long. Moreover, the photon dosage required to perform such an exhaustive set of measurements would threaten the integrity of the structures under measurement.

An efficient measurement of the semiconductor structure provides the minimum set of signal information required to estimate a value of a parameter of interest with the required levels of measurement uncertainty and measurement robustness.

In one aspect, a measurement recipe is rapidly generated to achieve an efficient measurement of a semiconductor structure by repeatedly updating the measurement recipe as measurement data is collected before the queue of measurements defined by the previous measurement recipe are executed. The measurement recipe is repeatedly updated based on newly acquired measurement data until a desired measurement uncertainty is achieved or the maximum allowed measurement time is reached.

Figure 1:
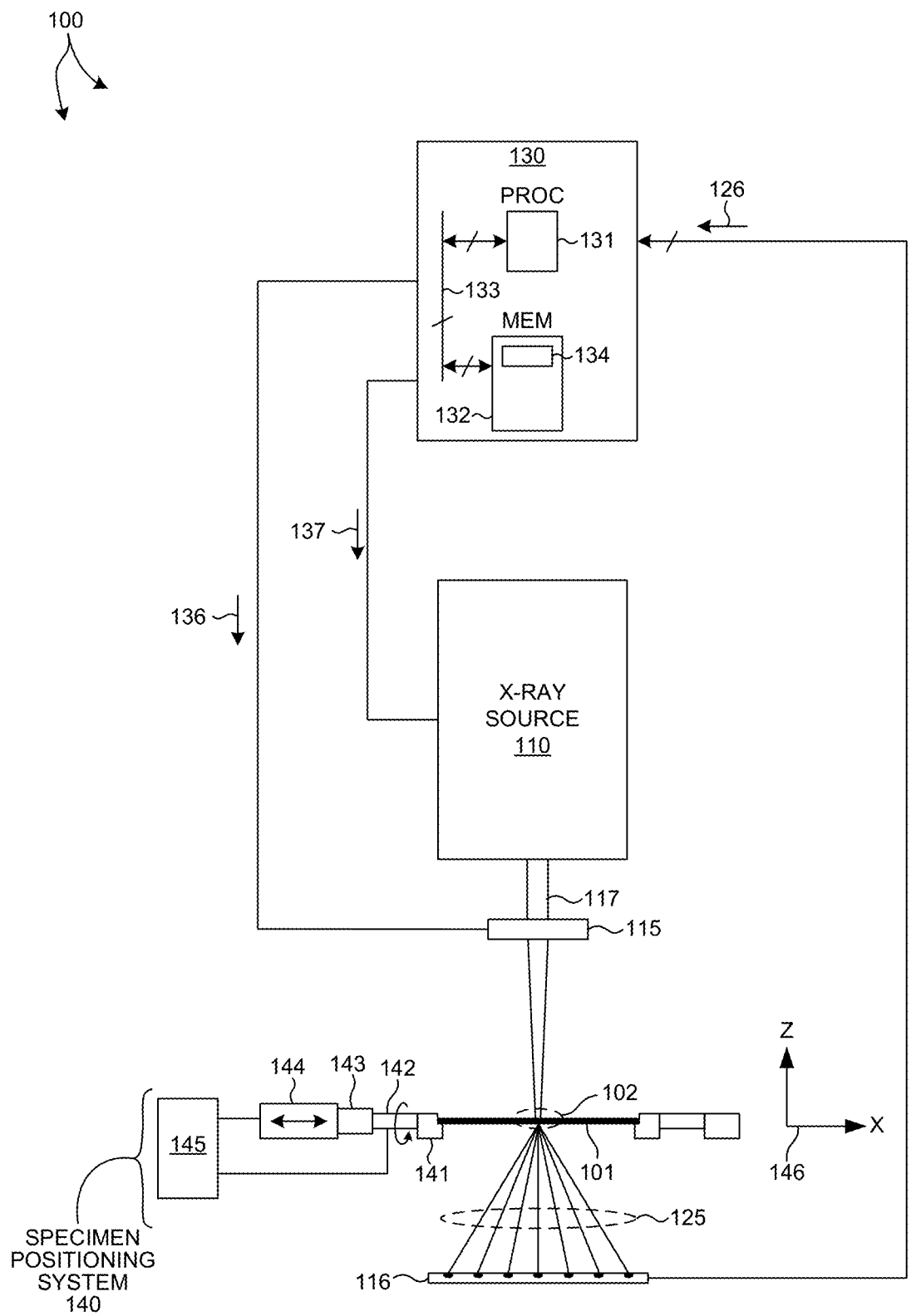
FIG. 1 is a diagram illustrative of a metrology system 100 configured to measure characteristics of a specimen in accordance with the methods described herein.

FIG. 1 illustrates an embodiment of a metrology tool 100 for measuring characteristics of a specimen in accordance with the exemplary methods presented herein. As shown in FIG. 1, the system 100 may be used to perform x-ray scatterometry measurements over an inspection area 102 of a specimen 101 disposed on a specimen positioning system 140. In some embodiments, the inspection area 102 has a spot size of eighty micrometers or less. In some embodiments, the inspection area 102 has a spot size of fifty micrometers or less. In some embodiments, the inspection area 102 has a spot size of forty micrometers or less.

In the depicted embodiment, metrology tool 100 includes an x-ray illumination source 110 configured to generate x-ray radiation suitable for x-ray scatterometry measurements. In some embodiments, the x-ray illumination system 110 is configured to generate wavelengths between 0.01 nanometers and 1 nanometer. X-ray illumination source 110 produces an x-ray beam 117 incident on inspection area 102 of specimen 101.

In general, any suitable high-brightness x-ray illumination source capable of generating high brightness x-rays at flux levels sufficient to enable high-throughput, inline metrology may be contemplated to supply x-ray illumination for x-ray scatterometry measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, and an inverse Compton source may be employed as x-ray source 110. In one example, an inverse Compton source available from Lyncean Technologies, Inc., Palo Alto, Calif. (USA) may be contemplated. Inverse Compton sources have an additional advantage of being able to produce x-rays over a range of photon energies, thereby enabling the x-ray source to deliver x-ray radiation at different, selectable wavelengths.

Figure 2:
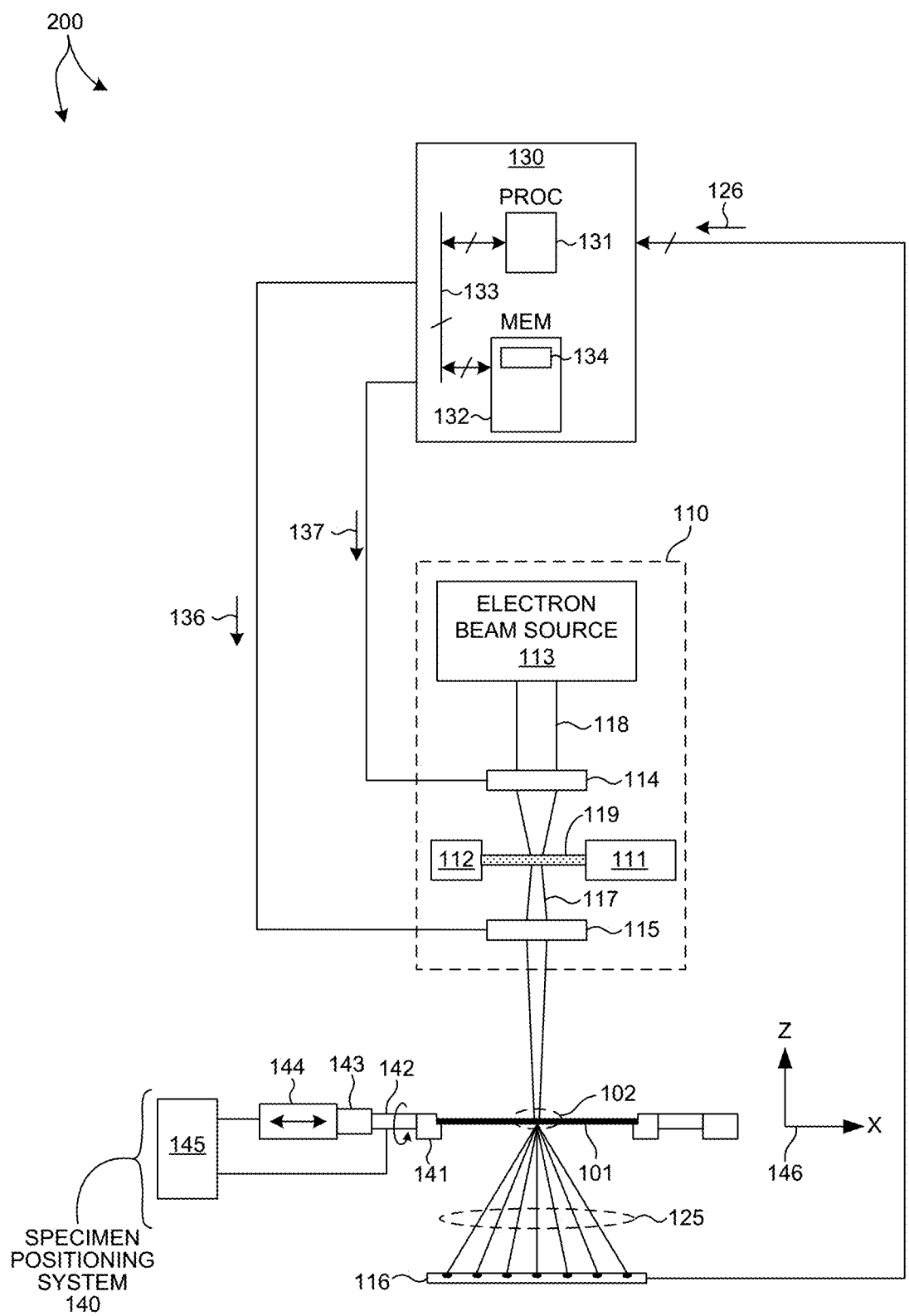
FIG. 2 is a diagram illustrative of a metrology tool 200 in another embodiment configured to measure characteristics of a specimen in accordance with the methods presented herein.

Exemplary x-ray sources include electron beam sources configured to bombard solid or liquid targets to stimulate x-ray radiation. FIG. 2 depicts a metrology tool 200 for measuring characteristics of a specimen in accordance with the exemplary methods presented herein. Like numbered elements of metrology tool 100 and 200 are analogous. However, in the embodiment depicted in FIG. 2, x-ray illumination source 110 is a liquid metal based x-ray illumination system. A jet of liquid metal 119 is produced from a liquid metal container 111 and collected in a liquid metal collector 112. A liquid metal circulation system (not shown) returns liquid metal collected by collector 112 to liquid metal container 111. The jet of liquid metal 119 includes one or more elements. By way of non-limiting example, the jet of liquid metal 119 includes any of Aluminum, Gallium, Indium, Tin, Thallium, and Bismuth. In this manner, the jet of liquid metal 119 produces x-ray lines corresponding with its constituent elements. In one embodiment, the jet of liquid metal includes a Gallium and Indium alloy. In some embodiments, the x-ray illumination system 110 is configured to generate wavelengths between 0.01 nanometers and 1 nanometer. An electron beam source 113 (e.g., electron gun) produces a stream of electrons 118 that is directed by electron optics 114 to the jet of liquid metal 119. Suitable electron optics 114 includes electromagnets, permanent magnets, or a combination of electromagnets and permanent magnets for focusing the electron beam and directing the beam at the liquid metal jet. The coincidence of the jet of liquid metal 119 and the stream of electrons 118 produces an x-ray beam 117 incident on inspection area 102 of specimen 101.

Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

In one embodiment, the incident x-ray beam 117 is at the Indium kα line of 24.2 keV. The x-ray beam is collimated down to less than one milliradian divergence using multilayer x-ray optics for x-ray scatterometry measurements.

In some embodiments, the x-ray scattering measurements described herein are achieved without using a screen located between the x-ray source and the specimen under measurement. In these embodiments, the measured intensities of the incident beam over a range of angles of incidence, multiple wavelengths, or a combination of both, provide sufficient information to resolve a distribution map (i.e., image) of a desired material property (e.g., complex refractive index, electron density, or absorptivity) of the measured structure. However, in some other examples, a pinhole or another aperture is located on an otherwise opaque screen that is located between the x-ray source and the specimen under measurement to improve collimation of the x-ray beam. The intensity of the diffraction pattern is measured for several positions of the aperture. In some other embodiments, a screen with a pseudo-random aperture pattern is used, and the diffraction pattern is measured for multiple screens. These approaches may also be contemplated to provide additional information to resolve the three-dimensional distribution of the desired material property of the measured structure.

In some embodiments, the profile of the incident x-ray beam is controlled by two or more apertures, slits, or a combination thereof. In a further embodiment, the apertures, slits, or both, are configured to rotate in coordination with the orientation of the specimen to optimize the profile of the incident beam for each angle of incidence, azimuth angle, or both.

As depicted in FIG. 1, x-ray optics 115 shape and direct incident x-ray beam 117 to specimen 101. In some examples, x-ray optics 115 include an x-ray monochromator to monochromatize the x-ray beam that is incident on the specimen 101. In one example, a crystal monochromator such as a Loxley-Tanner-Bowen monochromator is employed to monochromatize the beam of x-ray radiation. In some examples, x-ray optics 115 collimate or focus the x-ray beam 117 onto inspection area 102 of specimen 101 to less than 1 milliradian divergence using multilayer x-ray optics. In some embodiments, x-ray optics 115 includes one or more x-ray collimating mirrors, x-ray apertures, x-ray beam stops, refractive x-ray optics, diffractive optics such as zone plates, specular x-ray optics such as grazing incidence ellipsoidal mirrors, polycapillary optics such as hollow capillary x-ray waveguides, multilayer optics, or systems, or any combination thereof. Further details are described in U.S. Patent Publication No. 2015/0110249, the content of which is incorporated herein by reference it its entirety.

In general, the focal plane of the illumination optics system is optimized for each measurement application. In this manner, system 100 is configured to locate the focal plane at various depths within the specimen depending on the measurement application.

X-ray detector 116 collects x-ray radiation 125 scattered from specimen 101 and generates an output signal 126 indicative of properties of specimen 101 that are sensitive to the incident x-ray radiation in accordance with an x-ray scatterometry measurement modality. In some embodiments, scattered x-rays 125 are collected by x-ray detector 116 while specimen positioning system 140 locates and orients specimen 101 to produce angularly resolved scattered x-rays.

In some embodiments, an x-ray scatterometry system includes one or more photon counting detectors with high dynamic range (e.g., greater than $10^5$) and thick, highly absorptive crystal substrates that absorb the direct beam (i.e., zero order beam) without damage and with minimal parasitic backscattering. In some embodiments, a single photon counting detector detects the position and number of detected photons.

Full beam x-ray scatterometry requires collection of the zero order beam along with higher diffraction orders. The zero order beam is several orders of magnitude more intense than the other orders. If the zero order beam is not fully absorbed in the X-Ray sensitive section of the detector, it will scatter and generate parasitic signals. The strength of these parasitic signals limits the dynamic range of the measurement. For example, if the parasitic signal is $10^{-4}$ of the largest flux signal (i.e., the zero order signal), the signals associated with many higher orders will be contaminated.

Thus, it is critical that the detector (e.g., detector 116) exhibit high conversion efficiency of X-rays to electron hole pairs and high X-ray absorption to increase the effective dynamic range of the full beam metrology.

Exemplary detector materials suitable for full beam x-ray scatterometry include Cadmium Telluride (CdTe), Germanium (Ge) and Gallium Arsenide (GaAs) crystals, and others. In some embodiments, the detector material is selected to provide high conversion efficiency in a narrow energy band corresponding to the source energy.

In some embodiments, the thickness of the detector material is selected to achieve the desired absorption of incoming X-rays. In some embodiments, the detector is tilted with respect to the incoming X-ray beams (the various diffraction orders) to increase the path length of the X-ray beams through the detector material, and thus, increase the total amount of absorption.

In some embodiments, dual threshold detectors are employed to improve SNR.

In some embodiments, the x-ray detector resolves one or more x-ray photon energies and produces signals for each x-ray energy component indicative of properties of the specimen. In some embodiments, the x-ray detector 116 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 126 for further processing and storage.

In some embodiments, the detector is scanned relative to the incoming X-rays to mitigate damage or excessive charging from the incident zero order beam. In some of these embodiments, the detector is continuously scanned with respect to the incoming X-rays to avoid having the zero order beam dwell on a particular location on the detector surface for an extended period of time. In some other embodiments, the detector is periodically moved with respect to the incoming X-rays to avoid having the zero order beam dwell on a particular location on the detector surface for an extended period of time. In some embodiments, the scanning or periodic movements are approximately perpendicular to the incoming X-rays. In some embodiments, the movements are rotational (e.g., the detector is rotated such that a particular location on the detector surface traces out a circle in space). In some embodiments, the movements are a combination of translational movements that move the point of incidence of the zero order beam to various different locations on the detector surface.

In a further aspect, an x-ray scatterometry system is employed to determine properties of a specimen (e.g., structural parameter values) based on one or more measured diffraction orders. As depicted in FIG. 1, metrology tool 100 includes a computing system 130 employed to acquire signals 126 generated by detector 116 and determine properties of the specimen based at least in part on the acquired signals.

In an x-ray scatterometry measurement, a structure (e.g., a high aspect ratio, vertically manufactured structure) diffracts a collimated X-ray beam into diffraction orders. Each diffraction order travels in a particular, predictable direction. The angular spacing of the diffraction orders is inversely proportional to the lattice constant of the specimen divided by the wavelength. The diffraction orders are detected by a detector array placed at some distance from the wafer. Each pixel of the detector outputs a signal that indicates the number of photons that hit the pixel.

The intensities of diffraction orders are of the form $I(m,n,\theta,\phi,\lambda)$, where $\{m,n\}$ are integer indices of diffraction orders, $\{\theta,\phi\}$ are elevation and azimuth angles of the incident beam (i.e., polar coordinates of the incident chief ray with respect to a coordinate system that is fixed to the wafer), and $\lambda$ is the wavelength of the incident X-ray.

Several noise sources perturb the illumination light as it exits the illumination and propagates toward the specimen. Exemplary disturbances include electron beam current fluctuation, temperature induced optic drift, etc. The perturbed incident flux is denoted as $F_0(1+n_1)$.

The target scatters the incident radiation in a manner that depends on the azimuth and elevation angles of the incident beam. The efficiency of light scattering into orders (m,n) can be defined as $S_{mn}(\theta,\phi)$. As the diffracted light propagates from the specimen to the detector, the beam passes through other scattering media that affect all orders similarly with some variation $(1+n_2)$ and parasitic noise $(n_3)$. In this manner the total intensity $I_{mn}$ of each order measured in a time, t, can be expressed by equation (1).

$$I_{mn}=S_{mn}(\theta,\phi)(1+n_2)(1+n_1)F_0 t+n_3 \qquad (1)$$

In some embodiments, it is desirable to perform measurements at different orientations described by rotations about the x and y axes indicated by coordinate system 146 depicted in FIG. 1. This increases the precision and accuracy of measured parameters and reduces correlations among parameters by extending the number and diversity of data sets available for analysis to include a variety of large-angle, out of plane orientations. Measuring specimen parameters with a deeper, more diverse data set also reduces correlations among parameters and improves measurement accuracy. For example, in a normal orientation, x-ray scatterometry is able to resolve the critical dimension of a feature, but is largely insensitive to sidewall angle and height of a feature. However, by collecting measurement data over a broad range of out of plane angular positions, the sidewall angle and height of a feature can be resolved.

As illustrated in FIG. 1, metrology tool 100 includes a specimen positioning system 140 configured to both align specimen 101 and orient specimen 101 over a large range of out of plane angular orientations with respect the scatterometer. In other words, specimen positioning system 140 is configured to rotate specimen 101 over a large angular range about one or more axes of rotation aligned in-plane with the surface of specimen 101. In some embodiments, specimen positioning system 140 is configured to rotate specimen 101 within a range of at least 90 degrees about one or more axes of rotation aligned in-plane with the surface of specimen 101. In some embodiments, specimen positioning system is configured to rotate specimen 101 within a range of at least 120 degrees about one or more axes of rotation aligned in-plane with the surface of specimen 101. In some other embodiments, specimen positioning system is configured to rotate specimen 101 within a range of at least one degree about one or more axes of rotation aligned in-plane with the surface of specimen 101. In this manner, angle resolved measurements of specimen 101 are collected by metrology system 100 over any number of locations on the surface of specimen 101. In one example, computing system 130 communicates command signals to motion controller 145 of specimen positioning system 140 that indicate the desired position of specimen 101. In response, motion controller 145 generates command signals to the various actuators of specimen positioning system 140 to achieve the desired positioning of specimen 101.

By way of non-limiting example, as illustrated in FIG. 1, specimen positioning system 140 includes an edge grip chuck 141 to fixedly attach specimen 101 to specimen positioning system 140. A rotational actuator 142 is configured to rotate edge grip chuck 141 and the attached specimen 101 with respect to a perimeter frame 143. In the depicted embodiment, rotational actuator 142 is configured to rotate specimen 101 about the x-axis of the coordinate system 146 illustrated in FIG. 1. As depicted in FIG. 1, a rotation of specimen 101 about the z-axis is an in plane rotation of specimen 101. Rotations about the x-axis and the y-axis (not shown) are out of plane rotations of specimen 101 that effectively tilt the surface of the specimen with respect to the metrology elements of metrology system 100. Although it is not illustrated, a second rotational actuator is configured to rotate specimen 101 about the y-axis. A linear actuator 144 is configured to translate perimeter frame 143 in the x-direction. Another linear actuator (not shown) is configured to translate perimeter frame 143 in the y-direction. In this manner, every location on the surface of specimen 101 is available for measurement over a range of out of plane angular positions. For example, in one embodiment, a location of specimen 101 is measured over several angular increments within a range of −45 degrees to +45 degrees with respect to the normal orientation of specimen 101.

In general, specimen positioning system 140 may include any suitable combination of mechanical elements to achieve the desired linear and angular positioning performance, including, but not limited to goniometer stages, hexapod stages, angular stages, and linear stages.

Figure 3:
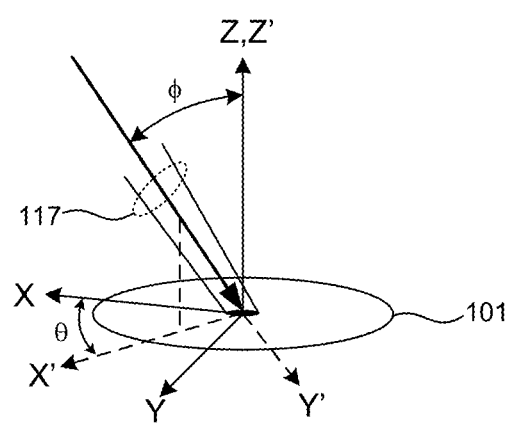
FIG. 3 depicts x-ray illumination beam 117 incident on wafer 101 at a particular orientation described by angles φ and θ.

As described herein, x-ray scatterometry measurements are performed at multiple orientations of the illuminating x-ray beam relative to the surface normal of the semiconductor wafer. Each orientation is described by any two angular rotations of wafer 101 with respect to the x-ray illumination beam, or vice-versa. In one example, the orientation can be described with respect to a coordinate system fixed to the wafer. FIG. 3 depicts x-ray illumination beam 117 incident on wafer 101 at a particular orientation described by angles $\phi$ and $\theta$. Coordinate frame XYZ is fixed the metrology system and coordinate frame X'Y'Z' is fixed to wafer 101. Z is aligned with an axis normal to the surface of wafer 101. X and Y are in a plane aligned with the surface of wafer 101. Similarly, Z' is aligned with an axis normal to the surface of wafer 101, and X' and Y' are in a plane aligned with the surface of wafer 101. As depicted in FIG. 3, x-ray illumination beam 117 lies within the X'Z' plane. Angle, $\phi$, describes the orientation of the x-ray illumination beam 117 with respect to the surface normal of the wafer in the X'Z' plane. Furthermore, angle, $\theta$, describes the orientation of the X'Z' plane with respect to the XZ plane. Together, $\theta$ and $\phi$, uniquely define the orientation of the x-ray illumination beam 117 with respect to the surface of wafer 101. In this example, the orientation of the x-ray illumination beam with respect to the surface of wafer 101 is described by a rotation about an axis normal to the surface of wafer 101 (i.e., Z axis) and a rotation about an axis aligned with the surface of wafer 101 (i.e., Y' axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis as described with reference to FIG. 1.

Figure 4:
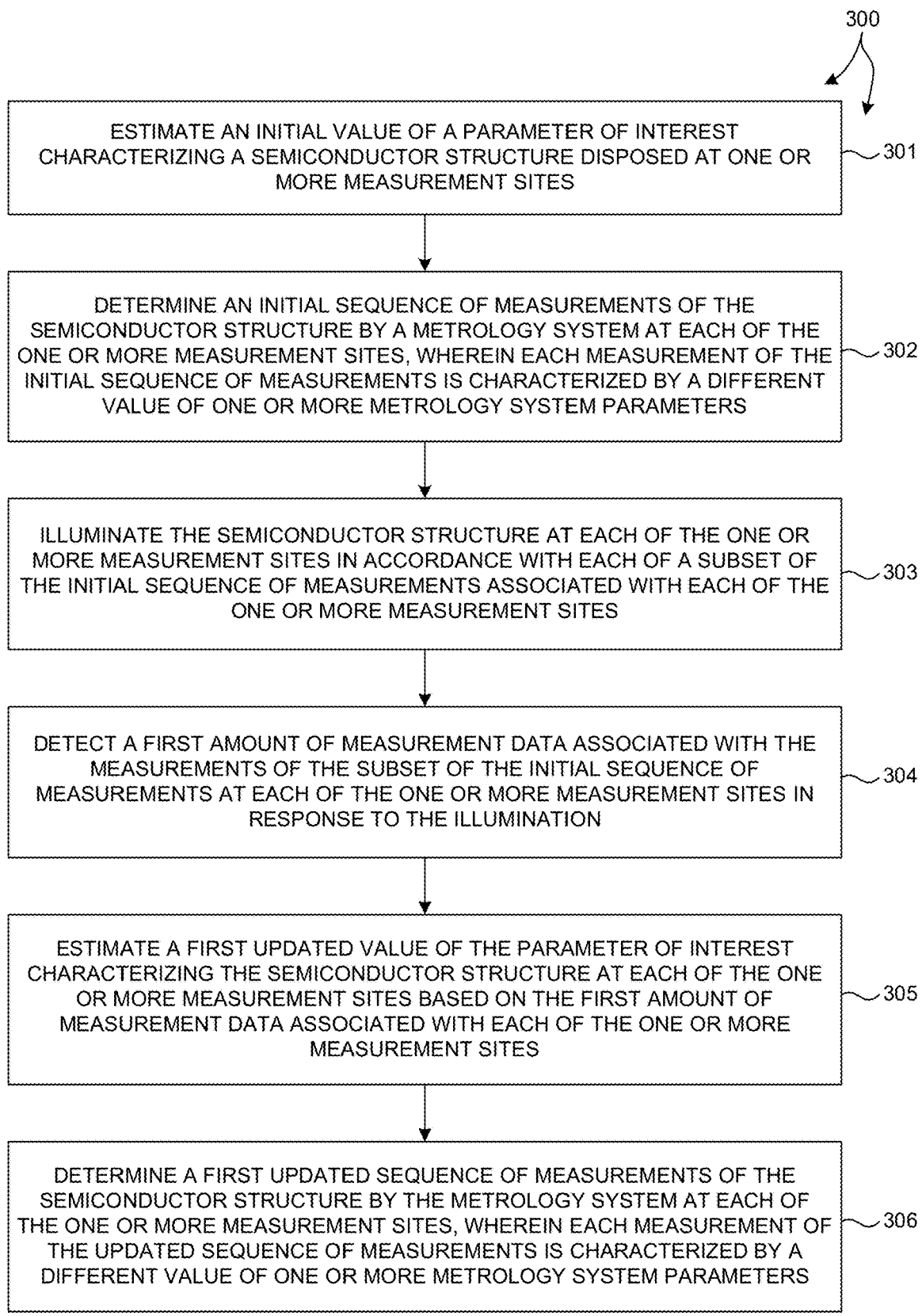
FIG. 4 depicts a flowchart illustrative of an exemplary method 300 of measurement recipe optimization as described herein.

FIG. 4 illustrates a method 300 suitable for implementation by the metrology systems 100 and 200 of the present invention. In one aspect, it is recognized that data processing blocks of method 300 may be carried out via a pre-programmed algorithm executed by one or more processors of computing system 130. While the following description is presented in the context of metrology systems 100 and 200, it is recognized herein that the particular structural aspects of metrology systems 100 and 200 do not represent limitations and should be interpreted as illustrative only.

In block 301, an initial value of a parameter of interest characterizing a semiconductor structure disposed at one or more measurement sites is estimated. In some embodiments, a value of a parameter of interest (e.g., critical dimension, sidewall angle, height, overlay, etc.) is estimated based on available measurement data using an inverse solve technique such as model based regression, ptychography, tomography, one or more machine learning models, or a combination thereof.

In block 302, an initial sequence of measurements of the semiconductor structure by a metrology system is determined at each of the one or more measurement sites. Each measurement of the initial sequence of measurements is characterized by a different value of one or more metrology system parameters that define a configuration of the metrology system. In other words, the measurement system configuration (e.g., angle of incidence, divergence, azimuth angle, beam energy, integration time, etc., is different for each measurement of the initial sequence of measurements).

In some examples, the initial sequence of measurements is based in part on the initial value of the parameter of interest. In some examples, a simulation technique such as first order estimation, Monte-Carlo simulation, etc., is employed to identify a sequence of measurement system configurations that measure the parameter of interest with relatively low measurement uncertainty. In a further aspect, the sequence of measurement system configurations is ordered by the ability of each measurement configuration to reduce measurement uncertainty. In this manner, the sequence of measurements is an ordered queue of different measurements starting with a measurement having the smallest anticipated measurement uncertainty and continuing with measurements having increasingly larger anticipated measurement uncertainty.

In some embodiments, measurement signals are predicted by electromagnetic simulations, past measurements, a library generated by simulation or reference measurements, etc. The measurement uncertainty associated with measurement of the parameter of interest at the estimated value in accordance with a particular set of measurement system settings (i.e., a particular measurement) is evaluated. This is repeated to arrive at a sequence of measurements of the parameter of interest with relatively low measurement uncertainty. Possible measurement configurations are searched using, exhaustive search, simulated annealing, L1-norm regression, genetic search, trained models, etc. The trained models are based on decisions from previously listed methods, synthetic training sets, or actual results.

In one example, a structure is to be measured by a transmission small-angle x-ray scatterometry (T-SAXS) metrology system. In this example, the expected pitch influences the selection of the illumination beam divergence having highest sensitivity to pitch measurement. In addition, the periodicity of the structure influences the selection of illumination angles having highest sensitivity to depth of the structure. In this way, expectations of measurement results guide measurement strategy.

In block 303, the semiconductor structure is illuminated at each of the one or more measurement sites in accordance with each of a subset of the initial sequence of measurements associated with each of the one or more measurement sites.

In block 304, a first amount of measurement data associated with the measurements of the subset of the initial sequence of measurements is detected at each of the one or more measurement sites in response to the illumination.

In block 305, a first updated value of the parameter of interest characterizing the semiconductor structure is estimated at each of the one or more measurement sites based on the first amount of measurement data associated with each of the one or more measurement sites.

In some examples, metrology based on x-ray scatterometry involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

In a further aspect, computing system 130 is configured to generate a structural model (e.g., geometric model, material model, or combined geometric and material model) of a measured structure of a specimen, generate a x-ray scatterometry response model that includes at least one geometric parameter from the structural model, and resolve at least one specimen parameter value by performing a fitting analysis of x-ray scatterometry measurement data with the x-ray scatterometry response model. The analysis engine is used to compare the simulated x-ray scatterometry signals with measured data thereby allowing the determination of geometric as well as material properties such as electron density of the sample. In the embodiment depicted in FIG. 1, computing system 130 is configured as a model building and analysis engine configured to implement model building and analysis functionality as described herein.

Figure 5:
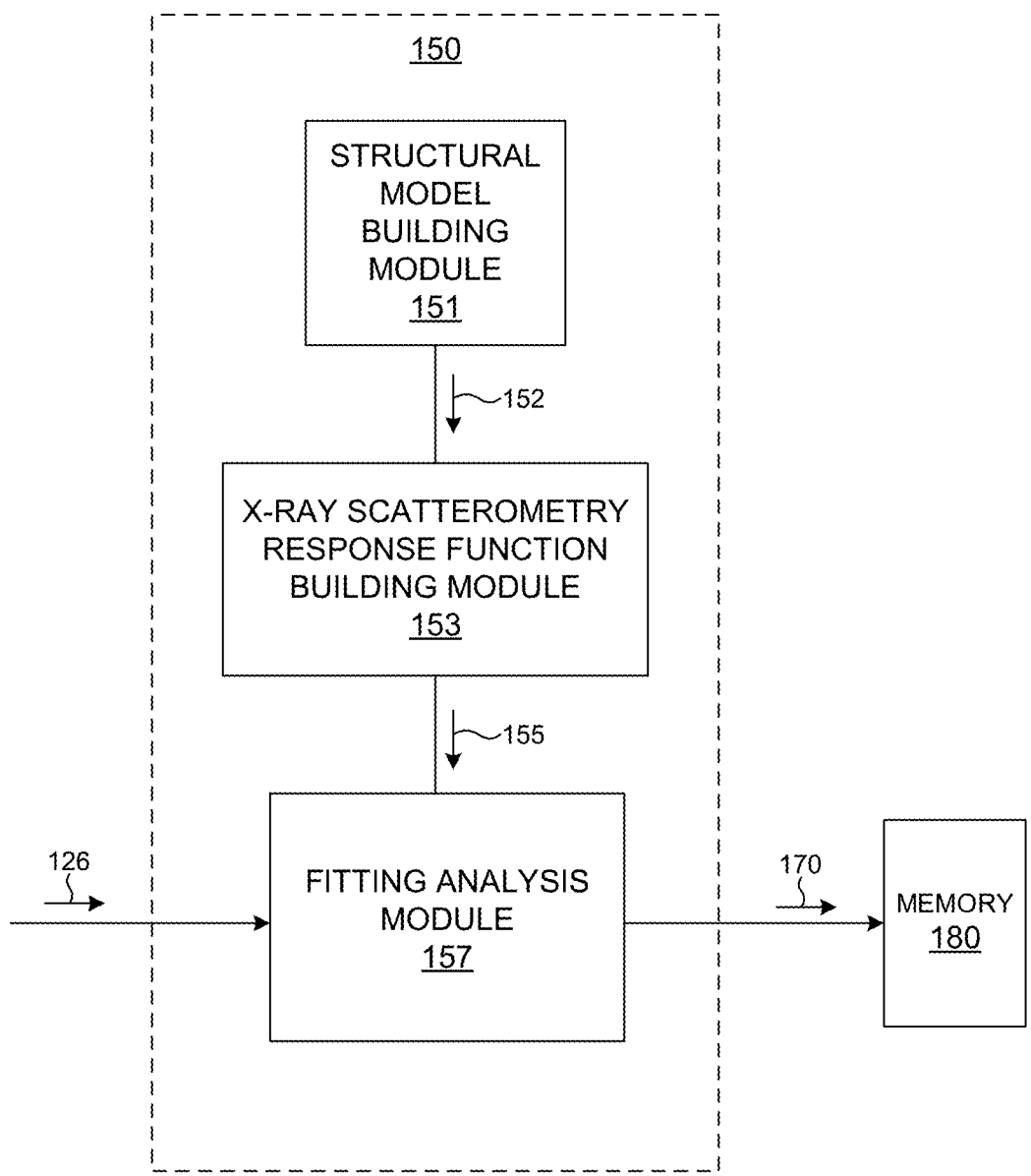
FIG. 5 is a diagram illustrative of a model building and analysis engine 150 configured to resolve specimen parameter values based on x-ray scatterometry data in accordance with the methods described herein.

FIG. 5 is a diagram illustrative of an exemplary model building and analysis engine 150 implemented by computing system 130. As depicted in FIG. 5, model building and analysis engine 150 includes a structural model building module 151 that generates a structural model 152 of a measured structure of a specimen. In some embodiments, structural model 152 also includes material properties of the specimen. The structural model 152 is received as input to x-ray scatterometry response function building module 153. x-ray scatterometry response function building module 153 generates a x-ray scatterometry response function model 155 based at least in part on the structural model 152. In some examples, the x-ray scatterometry response function model 155 is based on x-ray form factors, $$F(\vec{q}) = \int \rho(\vec{r}) e^{-i\vec{q}\cdot\vec{r}} d\vec{r} \qquad (2)$$

where F is the form factor, q is the scattering vector, and ρ(r) is the electron density of the specimen in spherical coordinates. The x-ray scattering intensity is then given by $$I(\vec{q}) = F^*F. \qquad (3)$$

X-ray scatterometry response function model 155 is received as input to fitting analysis module 157. The fitting analysis module 157 compares the modeled x-ray scatterometry response with the corresponding measured data 126 to determine geometric as well as material properties of the specimen.

In some examples, the fitting of modeled data to experimental data is achieved by minimizing a chi-squared value. For example, for x-ray scatterometry measurements, a chi-squared value can be defined as $$\chi^2_{SAXS} = \frac{1}{N_{SAXS}} \sum_{j}^{N_{SAXS}} \frac{\left(S_j^{SAXS\ model}(v_1, \ldots, v_L) - S_j^{SAXS\ experiment}\right)^2}{\sigma^2_{SAXS,j}} \qquad (4)$$

Where, $S_j^{SAXS\ experiment}$ is the measured x-ray scatterometry signals 126 in the "channel" j, where the index j describes a set of system parameters such as diffraction order, energy, angular coordinate, etc. $S_j^{SAXS\ model}(v_1, \ldots, v_L)$ is the modeled x-ray scatterometry signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (4) assumes that the uncertainties associated with different channels are uncorrelated. In examples where the uncertainties associated with the different channels are correlated, a covariance between the uncertainties, can be calculated. In these examples a chi-squared value for x-ray scatterometry measurements can be expressed as $$\chi^2_{SAXS} = \frac{1}{N_{SAXS}} \left(\vec{S}_j^{SAXS.\ model}(v_1, \ldots, v_M) - \vec{S}_j^{SAXS.\ experiment}\right)^T \qquad (5)$$
$$V_{SAXS}^{-1} \left(\vec{S}_j^{SAXS.\ model}(v_1, \ldots, v_M) - \vec{S}_j^{SAXS.\ experiment}\right)$$

where, $V_{SAXS}$ is the covariance matrix of the SAXS channel uncertainties, and T denotes the transpose.

In some examples, fitting analysis module 157 resolves at least one specimen parameter value by performing a fitting analysis on x-ray scatterometry measurement data 126 with the x-ray scatterometry response model 155. In some examples, $\chi^2_{SAXS}$ is optimized.

As described hereinbefore, the fitting of x-ray scatterometry data is achieved by minimization of chi-squared values. However, in general, the fitting of x-ray scatterometry data may be achieved by other functions.

The fitting of x-ray scatterometry metrology data is advantageous for any type of x-ray scatterometry technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing x-ray scatterometry beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101.

In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 150 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In block 306, a first updated sequence of measurements of the semiconductor structure by the metrology system is determined at each of the one or more measurement sites. Each measurement of the updated sequence of measurements is characterized by a different value of one or more metrology system parameters.

In some examples, a sequence of measurements of the semiconductor structure by a metrology system includes measurements of one or more different target parameters (e.g., MCD, BCD, OVL, SWA, etc.). In this manner, the optimization of the measurement recipe includes a selection of one or more target parameters associated with a particular semiconductor structure that provide a better estimate of the parameter of interest (e.g., CD).

In some examples, a sequence of measurements of the semiconductor structure by the metrology system includes measurements of different targets associated with the semiconductor structure (e.g., different targets in the same die). In this manner, the optimization of the measurement recipe includes a selection of one or more targets associated with a particular semiconductor structure that provide a better estimate of the parameter of interest (e.g., overlay).

In some examples, the updated sequence of measurements includes a different set of illumination angles (e.g., angles of incidence and azimuth angles), different detector resolution, different exposure time, different target size, different source size, different collected energy, or any combination thereof.

Figure 6:
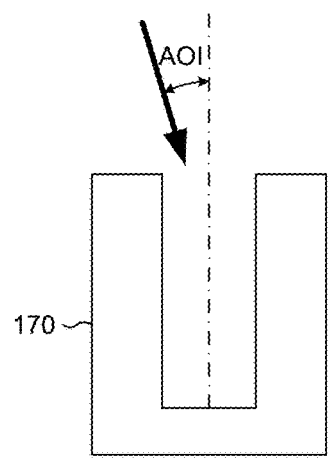
FIG. 6 is a diagram illustrative of a trench structure measured by a Transmission Small Angle X-Ray Scattering (T-SAXS) tool, such as metrology system 100.
Figure 8:
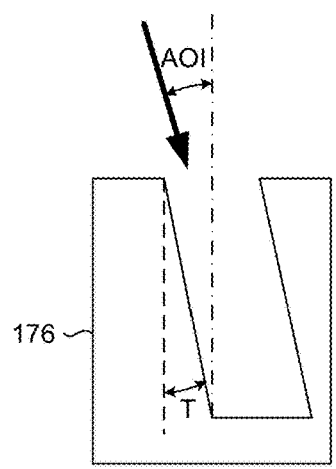
FIG. 8 is a diagram illustrative of another instance of a trench structure measured by a Transmission Small Angle X-Ray Scattering (T-SAXS) tool, such as metrology system 100.

FIG. 6 depicts a trench structure 170 to be measured by a Transmission Small Angle X-Ray Scattering (T-SAXS) tool, such as metrology system 100. FIG. 8 depicts another instance of a trench structure 176 to be measured by a Transmission Small Angle X-Ray Scattering (T-SAXS) tool, such as metrology system 100.

Figure 7A:
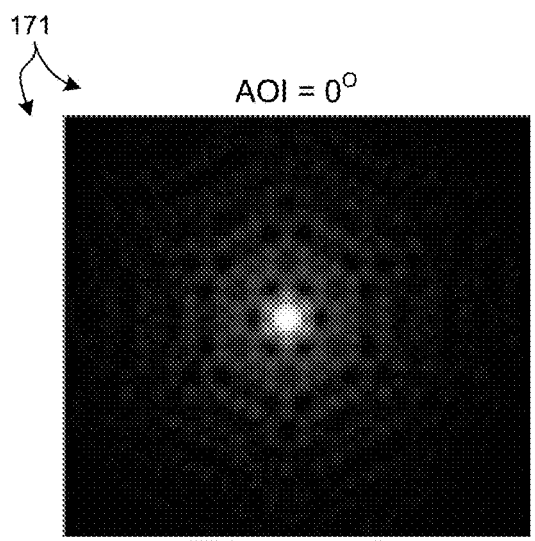
FIGS. 7A-7D depict images of scattered orders measured by metrology system 100 from the trench structure depicted in FIG. 6 at four different angles of incidence.
Figure 7B:
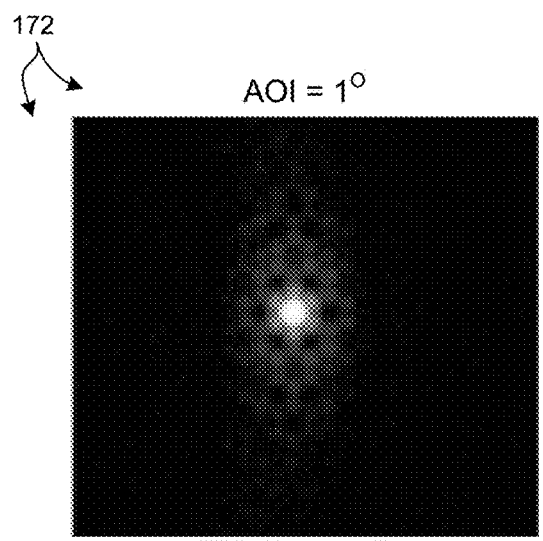
Figure 7C:
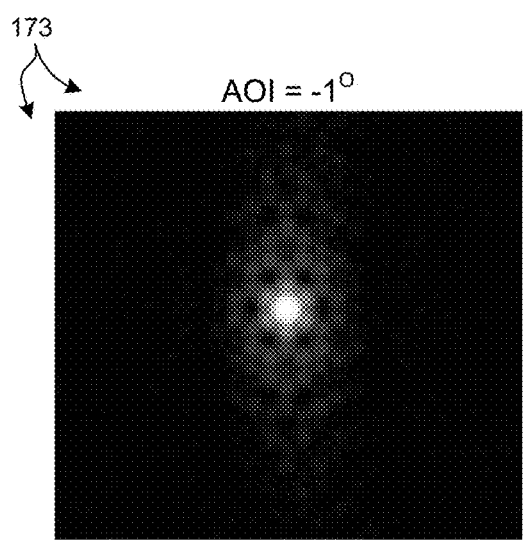
Figure 7D:
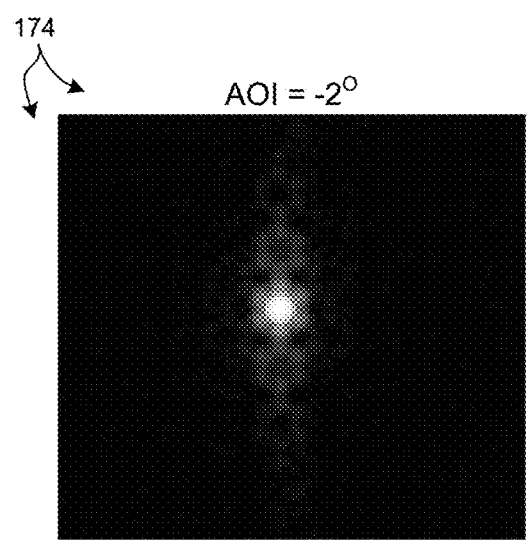

FIGS. 7A-7D depict images of scattered orders measured by metrology system 100 at four different angles of incidence. FIG. 7A depicts image 171 of scattered orders measured at an angle of incidence of zero degrees (i.e., normal to the surface of the wafer). FIG. 7B depicts image 172 of scattered orders measured at an angle of incidence of +1 degree. FIG. 7C depicts image 173 of scattered orders measured at an angle of incidence of −1 degree. FIG. 7D depicts image 174 of scattered orders measured at an angle of incidence of −2 degrees.

Figure 9A:
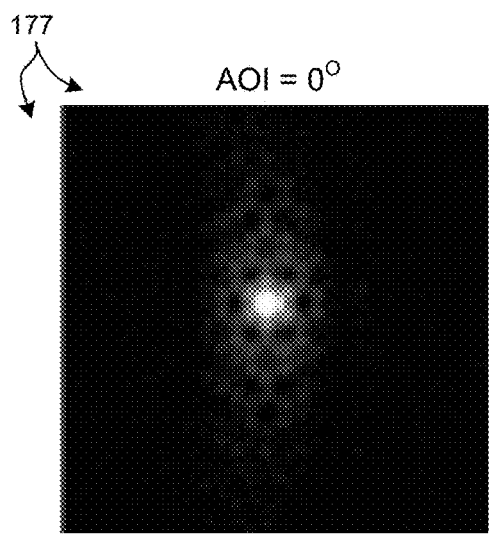
FIGS. 9A-9D depict images of scattered orders measured by metrology system 100 from the trench structure depicted in FIG. 8 at four different angles of incidence
Figure 9B:
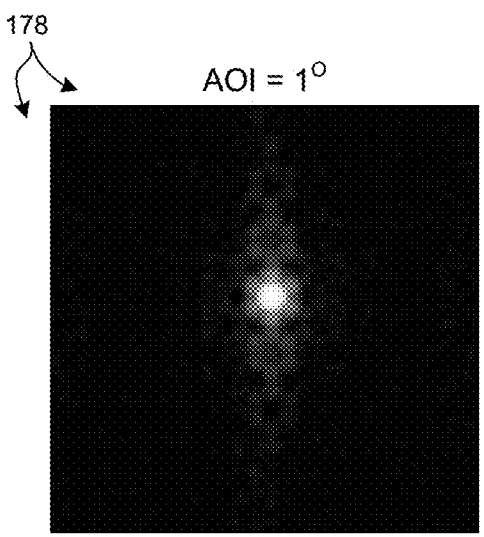
Figure 9C:
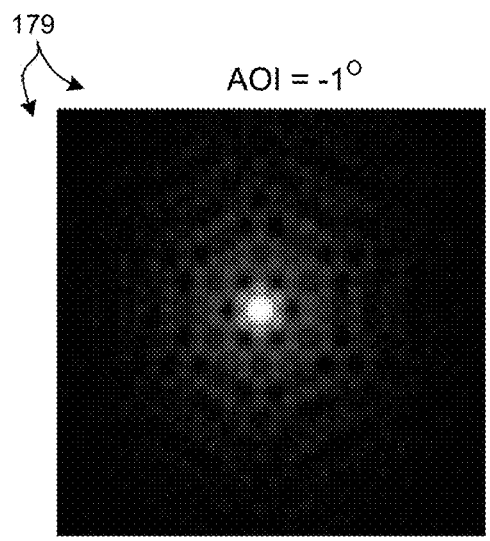
Figure 9D:
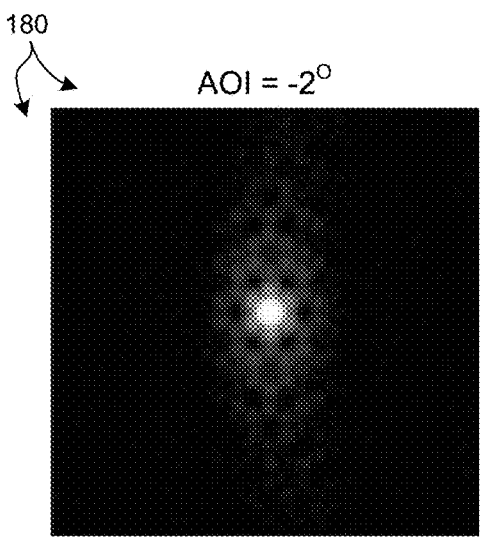

FIGS. 9A-9D depict images of scattered orders measured by metrology system 100 at four different angles of incidence. FIG. 9A depicts image 177 of scattered orders measured at an angle of incidence of zero degrees (i.e., normal to the surface of the wafer). FIG. 9B depicts image 178 of scattered orders measured at an angle of incidence of +1 degree. FIG. 9C depicts image 179 of scattered orders measured at an angle of incidence of −1 degree. FIG. 9D depicts image 180 of scattered orders measured at an angle of incidence of −2 degrees.

As illustrated in FIGS. 7A-7D and FIGS. 9A-9D, the bright spot in the center of each image is associated with the zero order beam. The intensity of each order can be extracted in many ways. In some embodiments, the diffraction orders are spatially separated at the detector. In these embodiments, the diffraction orders are individually detected by the detector array, and the outputs of pixels associated with the same diffraction order are combined (i.e., added). In this manner, detected diffraction orders are discriminated by accumulating photon counts of pixels associated with each particular diffraction order. This scenario is more likely to occur when measuring relatively small pitch features or when measuring with a beam having a relatively small divergence.

In some other embodiments, the diffraction orders spatially overlap at the detector and the pixel outputs cannot simply be combined to determine the intensity associated with a particular diffraction order. In these embodiments, a measurement model is employed to deconvolve the diffraction orders to discriminate the measured intensity of each detected diffraction order. This scenario is more likely to occur when measuring relatively large pitch features or when measuring with a beam having a relatively large divergence.

It is expected that the walls of the trench structures 170 and 176 are straight and oriented normal to the surface of the wafer within a process window. TSAXS measurements at the top of the structure where very high contrast edges generate a strong scattering signal are suitable measurements to assess tilt. If the trench is tilted, angles at the top generate relatively weak signals. Thus, measurements performed near the estimated tilt angles enable a fast measurement.

Ideally, knowledge of the range of angles possible in a stable process enables the generation of an efficient measurement recipe apiori. Unfortunately, many processes are not sufficiently stable and any measurement recipe synthesized based on the assumption of a stable process is highly susceptible to poor measurement performance on outliers. Thus, in practice, measurement recipe generation based on assumptions of stable processes is problematic, especially in light of the fact that effective detection of outliers is critical to robust process control.

In one example, TSAXS measurements of structures 170 and 176 are performed over a range of angles of incidence within the process window and beyond to capture outliers. For example, a measurement recipe including measurements of images 171-174 and 177-180 confirms zero tilt of structure 170 and a tilt of −1 degree of structure 176. However, the tilt measurement of each structure requires the measurement of four images. Although, this measurement recipe is robust, it requires an excessive number of measurements. For time consuming measurements, this approach is impractical.

In an example of conventional measurement recipe optimization, TSAXS measurements of structures 170 and 176 are performed over a range of angles of incidence within an expected process window that is smaller than a full process window. In one example, a measurement recipe includes tilt angles of +/−1 degree. In this example, the tilt measurement of each structure requires three images (i.e., images 171-173 and 177-179. The risk of this approach is that outliers (e.g., a tilt angle of −2 degrees) are missed, especially if the expected process window is selected to be excessively small. Conversely, if the expected process window is selected to be large to improve measurement robustness, the amount of data collection increases. This increases the risk that the measurement recipe becomes impractical to implement.

Updating a measurement recipe based on measurement data collected from a subset of measurements, as described herein, improves measurement robustness while reducing the amount of required data collection.

In the example depicted in FIG. 6, a measurement is performed at zero angle of incidence as depicted in FIG. 7A. The measured image depicted in FIG. 7A indicates that the trench is aligned with the angle of incidence (i.e., normal to the surface of the wafer). The measurement recipe is updated to add an additional measurement to confirm the estimate that structure 170 is not tilted. To confirm that structure 170 is not tilted, a second measurement is performed at +1 degree as depicted in FIG. 7B. In the example depicted in FIG. 8, a measurement is performed at zero angle of incidence as depicted in FIG. 9A. The measured image depicted in FIG. 9A indicates that the trench is not aligned with the angle of incidence (i.e., normal to the surface of the wafer). Furthermore, the measured diffraction pattern indicates that the tilt angle, T, is −1 degree. The measurement recipe is updated to add an additional measurement to confirm the estimate that structure 176 is tilted by −1 degree. To confirm that structure 176 is tilted by −1 degree, a second measurement is performed at −1 degree as depicted in FIG. 9C. The measured diffraction pattern confirms that the tilt angle is −1 degree. In these examples, a robust measurement is performed with two measurements, rather than three or four measurements.

In general, rather than collecting data associated with an entire, pre-programmed measurement recipe, measurement data collected from initial measurements is employed to update the measurement recipe to confirm the measurement with a minimum of additional data collection. Note that initial measurement data is not generally employed to provide a final estimate of the geometry of a semiconductor structure, rather the initial measurement data is employed to create an updated measurement recipe. The updated measurement recipe may confirm initial estimated parameter values or highlight that initial measurement data is an outlier and further measurements are required.

In the example depicted in FIG. 8, the initial measurement determines that structure 176 is likely a tilted structure, and the measurement queue is updated to confirm this estimate. Whether confirmed or disproved, the next collection refines the estimate and on average, decreases the acquisition time needed for a fixed measurement uncertainty.

As described herein, initial information about an expected wafer metrology result is employed to generate an initial measurement recipe. As initial measurement data is collected, the measurement recipe is updated.

Figure 10:
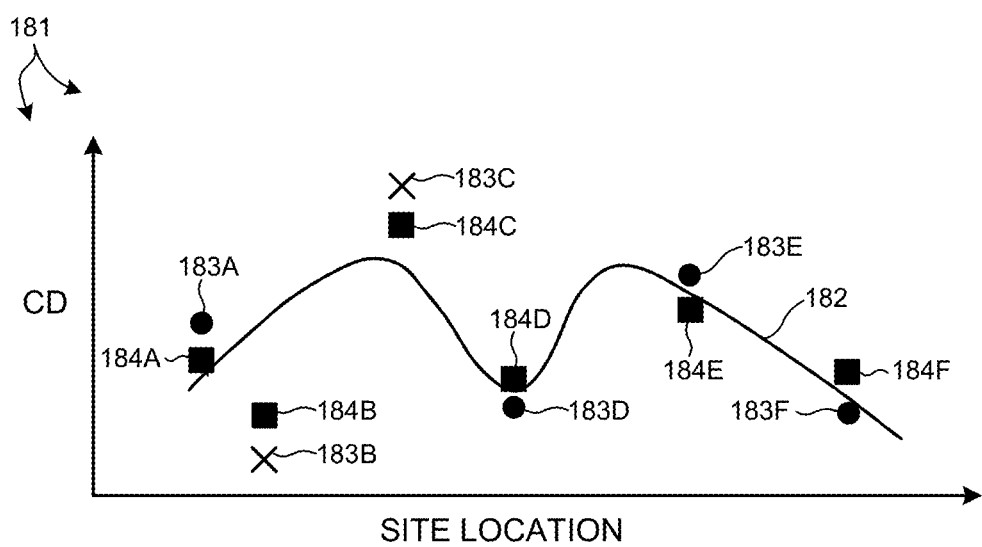
FIG. 10 depicts a plotline corresponding to initial estimates of critical dimension (CD) values as a function of site location on a wafer.

FIG. 10 depicts a plotline 182 corresponding to initial estimates of critical dimension (CD) values as a function of site location. Plotline 182 is estimated based on a known shape of the wafer under measurement. In this manner, known wafer trends are available to assist in estimates of CD values at different measurement sites. An initial measurement recipe is generated and measurements are performed at six measurement sites. The results are indicated by reference numerals 183A-F. As indicated in FIG. 10, measurements 183A, 183D, 183E, and 183F are close to the expected values indicated by plotline 182. These measurements are marked with a round dot in FIG. 10. These measurements are considered to be trusted measurements and are fully considered when generating an updated measurement recipe. Conversely, measurements 183B and 183C are relatively far from the expected values indicated by plotline 182. These measurements are marked with an "X" in FIG. 10. These measurements are de-weighted when generating an updated measurement recipe. An updated measurement recipe is generated and measurements are performed at the same six measurement sites. The results are indicated by reference numerals 184A-F. These measurements are generally closer to the expected values indicated by plotline 182. In the initial CD measurements, noise may drive low-sensitivity aspects of the measurement to incorrect values. However, with many measurements across a wafer, systematic trends typically become apparent. The estimates are refined and provide a more robust and efficient measurement recipe.

In some embodiments, measurement recipe optimization is controlled to trade off measurement robustness and measurement time. This enables flexibility in the case of outliers and process excursions.

In some embodiments, measurement recipe optimization is controlled to trade off measurement uncertainty and measurement throughput.

In some embodiments, measurement recipe optimization is controlled to minimize any combination of measurement uncertainty, measurement time, move time, and target dose. In some of these embodiments, measurement recipe optimization is controlled to minimize the sum of measurement time and move time for a sequence of collections. For example, if a measurement tool is also limited by the motion required to collect data, performing data collection in a specific order can reduce move time (i.e., time required to move the wafer and optical elements into position). This allows more actual data acquisition time and provides a faster overall measurement.

In some embodiments, the computations required to estimate an updated measurement recipe are longer than the time to collect a measurement data. In these embodiments, a measurement recipe is updated while measurement data is being collected. In some embodiments, a queue of measurements for each measurement site is updated only when an updated measurement recipe is available. In some embodiments, a measurement recipe is updated for one measurement site while data is collected at another measurement site. This approach makes sense when the move time between measurement sites is relatively small compared to the average acquisition time. This is generally the case for TSAXS measurements.

In some embodiments, target dose is considered as part of the measurement recipe optimization. There are many measurement scenarios (e.g., x-ray measurements of device structures, UV measurements of resist structures, etc.) where extended exposure affects the measurement or device performance at the end of processing. In these examples, the overall dose of energy delivered to the metrology target is considered as part of the measurement recipe optimization.

In general, a measurement recipe is updated iteratively until the final measurement meets the required level of uncertainty or the maximum time allowed for measurement expires.

Measurement recipe optimization as described herein may be performed on any number of different metrology systems, such as, but not limited to, x-ray transmission tools, x-ray reflection tools, infrared transmission tools, etc.

In a further aspect, the measurement quality and performance of the metrology system is controlled based on the measured zero order beam. In some examples, the estimates of measurement quality and performance described hereinbefore are provided as input to a feedback controller (e.g., computing system 130). The feedback controller communicates control commands that result in changes in state of one or more elements of the metrology system that improves measurement system quality and performance.

In some examples, the control commands are provided to the illumination source. In response, the electrical state of the illumination source is adjusted to change the scanned spot size and shape, illumination power, spot offsets, incident angles, etc.

In some examples, the control commands are provided to one or more positioning devices that control the location of one or more optical elements of the metrology system. In response, the one or more positioning devices changes a position/orientation of one or more optical elements to adjust the incidence angles, focal distance between the illumination source and illumination optics, beam positioning, location of the beam spot on the optic to minimize the effects of surface roughness, etc.

In a further aspect, x-ray scatterometry measurements are performed over a range of angles of incidence that provide sufficient resolution and depth of penetration to characterize high aspect ratio structures through their entire depth.

Measurements of the intensity of diffracted radiation as a function of x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

In some embodiments, x-ray detector 116 is maintained in the same atmospheric environment as specimen 101 (e.g., gas purge environment). However, in some embodiments, the distance between specimen 101 and x-ray detector 116 is lengthy and environmental disturbances (e.g., air turbulence) contribute noise to the detected signals. Hence in some embodiments, one or more of the x-ray detectors is maintained in a localized, vacuum environment separated from the specimen (e.g., specimen 101) by a vacuum window.

Similarly, in some embodiments, x-ray illumination source 110, illumination optics 115, or both, are maintained in the same atmospheric environment as specimen 101 (e.g., gas purge environment). However, in some embodiments, the optical path length between x-ray illumination source 110 and illumination optics 115 and the optical path length between illumination optics 115 and specimen 101 are long and environmental disturbances (e.g., air turbulence) contribute noise to the illumination beam. Hence in some embodiments, the x-ray illumination source, the illumination optics 115, or both, are maintained in a localized, vacuum environment separated from the specimen (e.g., specimen 101) by a vacuum window.

Figure 12:
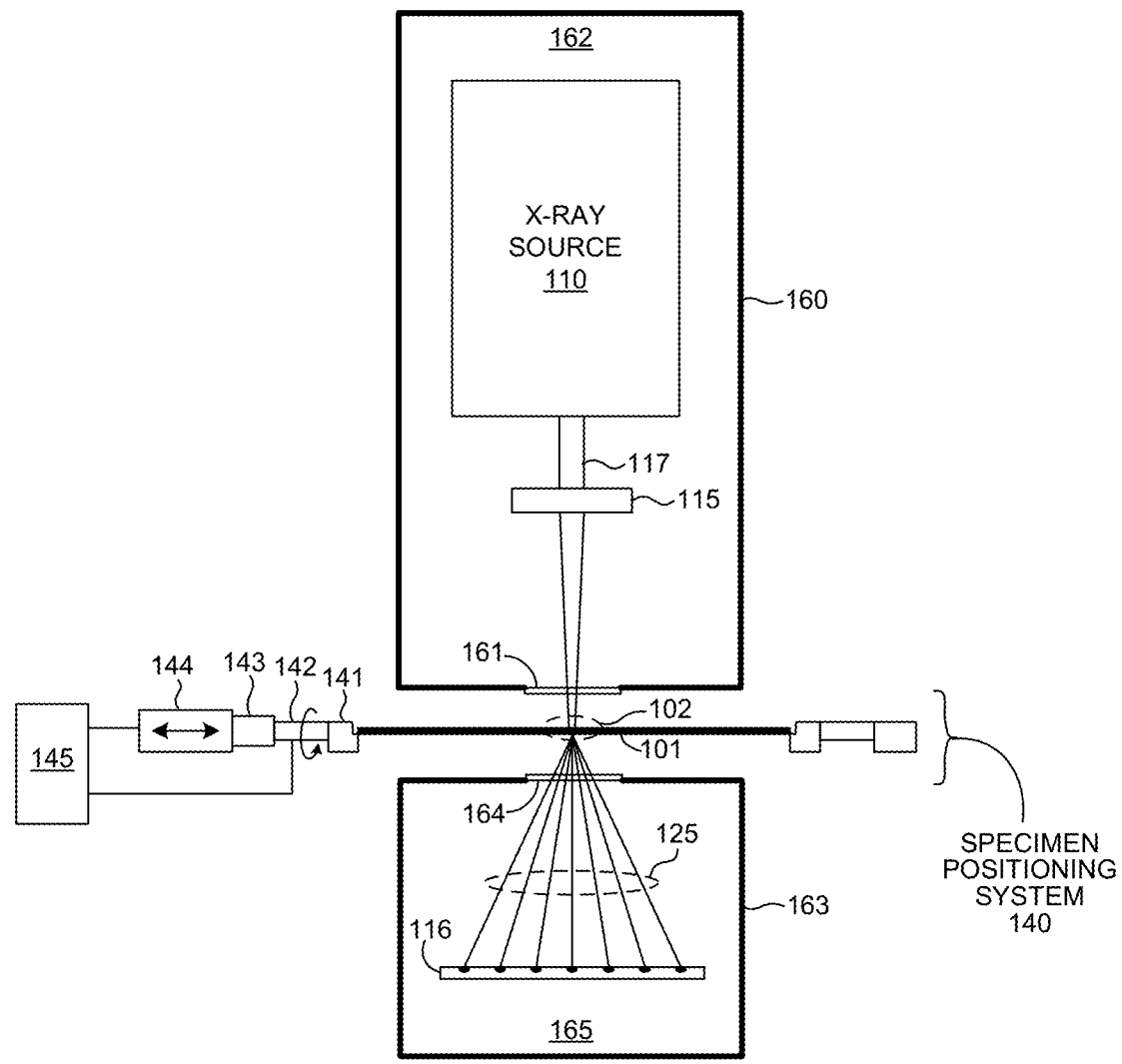
FIG. 12 is a diagram illustrative of elements of metrology systems 100 and 200 contained in vacuum environments separate from specimen 101.

FIG. 12 is a diagram illustrative of a vacuum chamber 160 containing x-ray illumination source 110 and illumination optics 115 and a vacuum chamber 160 containing x-ray detector 116 in one embodiment. In a preferred embodiment, vacuum chamber 160 includes a substantial portion of the optical path between x-ray illumination source 110 and specimen 101, and vacuum chamber 163 includes a substantial portion of the optical path between specimen 101 and x-ray detector 116. The openings of vacuum chamber 160 and vacuum chamber 163 are covered by vacuum windows 161 and 164, respectively. Vacuum windows 161 and 164 may be constructed of any suitable material that is substantially transparent to x-ray radiation (e.g., Beryllium). Illumination beam 117 passes through vacuum window 161 as it propagates toward specimen 101. After interaction with specimen 101, scattered x-ray radiation 125 passes through vacuum window 164, enters vacuum chamber 160 and is incident on x-ray detector 116. A suitable vacuum environment 162 is maintained within vacuum chamber 160 to minimize disturbances to the illumination beam 117, and a suitable vacuum environment 165 is maintained within vacuum chamber 163 to minimize disturbances to scattered x-ray radiation 125. A suitable vacuum environment may include any suitable level of vacuum, any suitable purged environment including an inert gas (e.g., helium), or any combination thereof. In this manner, as much of the beam path as possible is located in vacuum to maximize flux and minimize perturbations.

In some embodiments, the entire optical system, including specimen 101, is maintained in vacuum. However, in general, the costs associated with maintaining specimen 101 in vacuum are high due to the complexities associated with the construction of specimen positioning system 140.

In one further aspect, metrology tool 100 includes a computing system (e.g., computing system 130) configured to implement beam control functionality as described herein. In the embodiment depicted in FIG. 1, computing system 130 is configured as a beam controller operable to control any of the illumination properties such as intensity, divergence, spot size, polarization, spectrum, and positioning of the incident illumination beam 117.

As illustrated in FIG. 1, computing system 130 is communicatively coupled to detector 116. Computing system 130 is configured to receive measurement data 126 from detector 116. In one example, measurement data 126 includes an indication of the measured response of the specimen (i.e., intensities of the diffraction orders). Based on the distribution of the measured response on the surface of detector 116, the location and area of incidence of illumination beam 117 on specimen 101 is determined by computing system 130. In one example, pattern recognition techniques are applied by computing system 130 to determine the location and area of incidence of illumination beam 117 on specimen 101 based on measurement data 126. In some examples, computing system 130 communicates command signal 136 to illumination optics 115 to select the desired illumination wavelength and redirect and reshape illumination beam 117 such that incident illumination beam 117 arrives at the desired location and angular orientation with respect to specimen 101. In some other examples, computing system 130 communicates a command signal (not shown) to wafer positioning system 140 to position and orient specimen 101 such that incident illumination beam 117 arrives at the desired location and angular orientation with respect to specimen 101. In some other examples, computing system 130 communicates a command signal 137 to x-ray source 110 to select the desired illumination wavelength and redirect and reshape illumination beam 117 such that incident illumination beam 117 arrives at the desired location and angular orientation with respect to specimen 101.

In a further aspect, x-ray scatterometry measurement data is used to generate an image of a measured structure based on the measured intensities of the detected diffraction orders. In some embodiments, a x-ray scatterometry response function model is generalized to describe the scattering from a generic electron density mesh. Matching this model to the measured signals, while constraining the modelled electron densities in this mesh to enforce continuity and sparse edges, provides a three dimensional image of the sample.

Although, geometric, model-based, parametric inversion is preferred for critical dimension (CD) metrology based on x-ray scatterometry measurements, a map of the specimen generated from the same x-ray scatterometry measurement data is useful to identify and correct model errors when the measured specimen deviates from the assumptions of the geometric model.

In some examples, the image is compared to structural characteristics estimated by a geometric, model-based parametric inversion of the same scatterometry measurement data. Discrepancies are used to update the geometric model of the measured structure and improve measurement performance. The ability to converge on an accurate parametric measurement model is particularly important when measuring integrated circuits to control, monitor, and trouble-shoot their manufacturing process.

In some examples, the image is a two dimensional (2-D) map of electron density, absorptivity, complex index of refraction, or a combination of these material characteristics. In some examples, the image is a three dimensional (3-D) map of electron density, absorptivity, complex index of refraction, or a combination of these material characteristics. The map is generated using relatively few physical constraints. In some examples, one or more parameters of interest, such as critical dimension (CD), sidewall angle (SWA), overlay, edge placement error, pitch walk, etc., are estimated directly from the resulting map. In some other examples, the map is useful for debugging the wafer process when the sample geometry or materials deviate outside the range of expected values contemplated by a parametric structural model employed for model-based CD measurement. In one example, the differences between the map and a rendering of the structure predicted by the parametric structural model according to its measured parameters are used to update the parametric structural model and improve its measurement performance. Further details are described in U.S. Patent Publication No. 2015/0300965, the content of which is incorporated herein by reference it its entirety. Additional details are described in U.S. Patent Publication No. 2015/0117610, the content of which is incorporated herein by reference it its entirety.

In some embodiments, the metrology target characterized by x-ray scatterometry measurements as described herein is located within a scribe line of the wafer under measurement. In these embodiments, the metrology target is sized to fit within the width of the scribe line. In some examples, the scribe line width is less than eighty micrometers. In some examples, the scribe line is less than fifty micrometers. In general, the width of the scribe lines employed in semiconductor manufacturing is trending smaller.

In some embodiments, the metrology target characterized x-ray scatterometry measurements as described herein is located within an active die area of the wafer under measurement and is a part of a functional integrated circuit (e.g., memory, image sensor, logic device, etc.).

In general, a metrology target is characterized by an aspect ratio defined as a maximum height dimension (i.e., dimension normal to the wafer surface) divided by a maximum lateral extent dimension (i.e., dimension aligned with the wafer surface) of the metrology target. In some embodiments, the metrology target under measurement has an aspect ratio of at least twenty. In some embodiments, the metrology target has an aspect ratio of at least forty.

Figure 11A:
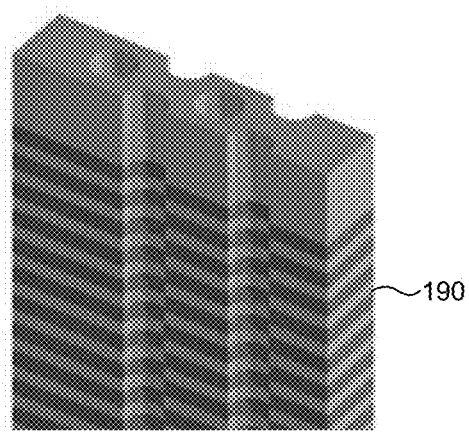
FIGS. 11A-11C depict an isometric view, a top view, and a cross-sectional view, respectively, of a typical 3D FLASH memory device 190 subject to measurement in the manner described herein.
Figure 11B:
Figure 11C:
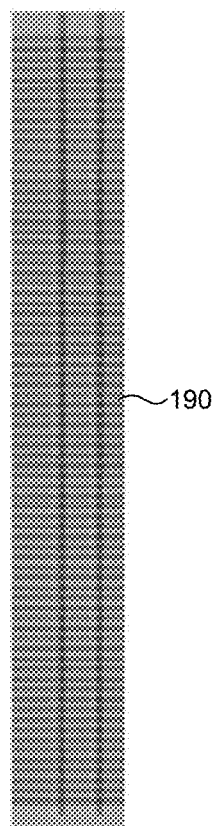

FIGS. 11A-11C depict an isometric view, a top view, and a cross-sectional view, respectively, of a typical 3D FLASH memory device 190 subject to measurement in the manner described herein. The total height (or equivalently depth) of memory device 190 ranges from one to several micrometers. Memory device 190 is a vertically manufactured device. A vertically manufactured device, such as memory device 190, essentially turns a conventional, planar memory device 90 degrees, orienting the bit line and cell string vertically (perpendicular to wafer surface). To provide sufficient memory capacity, a large number of alternating layers of different materials are deposited on the wafer. This requires patterning processes to perform well to depths of several microns for structures with a maximum lateral extent of one hundred nanometers or less. As a result, aspect ratios of 25 to 1 or 50 to 1 are not uncommon.

In general, the use of high brightness, x-ray scatterometry enables high flux x-ray radiation penetration into opaque areas of the target. Examples of measurable geometric parameters using x-ray scatterometry includes pore size, pore density, line edge roughness, line width roughness, side wall angle, profile, critical dimension, overlay, edge placement error, and pitch. An example of a measurable material parameter includes electron density. In some examples, x-ray scatterometry enables the measurement of features smaller than 10 nm as well as advanced semiconductor structures such as STT-RAM, V-NAND, DRAM, PC-RAM and Re-RAM, where measurements of geometrical parameters and material parameters are needed.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the detector 116 and the illumination optics 115 in any manner known in the art. For example, the one or more computing systems 130 may be coupled to computing systems associated with the detector 116 and the illumination optics 115, respectively. In another example, any of the detector 116 and the illumination optics 115 may be controlled directly by a single computer system coupled to computer system 130.

The computer system 130 may be configured to receive and/or acquire data or information from the subsystems of the system (e.g., detector 116 and illumination optics 115, and the like) by a transmission medium that may include wireline and/or wireless portions. In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 126) from a storage medium (i.e., memory 132 or 180) via a data link. For instance, spectral results obtained using a spectrometer of any of detector 116 may be stored in a permanent or semi-permanent memory device (e.g., memory 132 or 180). In this regard, the measurement results may be imported from on-board memory or from an external memory system. Moreover, the computer system 130 may send data to other systems via a transmission medium. For instance, specimen parameter values 170 determined by computer system 130 may be stored in a permanent or semi-permanent memory device (e.g., memory 180). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some embodiments, a scatterometry analysis as described herein is implemented as part of a fabrication process tool. Examples of fabrication process tools include, but are not limited to, lithographic exposure tools, film deposition tools, implant tools, and etch tools. In this manner, the results of a x-ray scatterometry analysis are used to control a fabrication process. In one example, x-ray scatterometry measurement data collected from one or more targets is sent to a fabrication process tool. The x-ray scatterometry measurement data is analyzed as described herein and the results used to adjust the operation of the fabrication process tool.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, and material parameters such as electron density, composition, grain structure, morphology, stress, strain, and elemental identification.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
   an x-ray illumination subsystem configured to illuminate a semiconductor structure with x-ray radiation at each of one or more measurement sites in accordance with each of a subset of an initial sequence of measurements associated with each of the one or more measurement sites, the subset of the initial sequence of measurements having fewer measurements than the initial sequence of measurements;
   an x-ray detector configured to detect a first amount of measurement data associated with the measurements of the subset of the initial sequence of measurements at each of the one or more measurement sites in response to the illumination provided by the x-ray illumination subsystem; and
   a computing system configured to
      estimate an initial value of a parameter of interest characterizing the semiconductor structure disposed at each of the one or more measurement sites;
      determine the initial sequence of measurements of the semiconductor structure by the metrology system at each of the one or more measurement sites, wherein each measurement of the initial sequence of measurements is characterized by a different value of one or more metrology system parameters that define a configuration of the metrology system;
      estimate a first updated value of the parameter of interest characterizing the semiconductor structure at each of the one or more measurement sites based on the first amount of measurement data associated with each of the one or more measurement sites, wherein the estimating of the first updated value of the parameter of interest characterizing the semiconductor structure at one measurement site of the one or more measurement sites is based on the first amount of measurement data associated with the measurements at a plurality of the one or more measurement sites; and
      determine a first updated sequence of measurements of the semiconductor structure by the metrology system at each of the one or more measurement sites based on the first amount of measurement data, wherein each measurement of the updated sequence of measurements is characterized by a different value of one or more metrology system parameters.

2. The metrology system of claim 1, wherein the x-ray illumination subsystem illuminates the semiconductor structure with x-ray radiation at each of one or more measurement sites in accordance with each of a subset of the first updated sequence of measurements associated with each of the one or more measurement sites, wherein the x-ray detector detects a second amount of measurement data associated with the measurements of the subset of the first updated sequence of measurements at each of the one or more measurement sites in response to the illumination provided by the x-ray illumination subsystem; and wherein the computing system is further configured to:
   estimate a measurement uncertainty associated with an estimation of a value of the parameter of interest based on the first updated sequence of measurements of the semiconductor structure by the metrology system at each of the one or more measurement sites;
   estimate a second updated value of the parameter of interest characterizing the semiconductor structure at each of the one or more measurement sites based on the second amount of measurement data; and
   determine a second updated sequence of measurements of the semiconductor structure by the metrology system, wherein each measurement of the second updated sequence of measurements is characterized by a different value of one or more metrology system parameters.

3. The metrology system of claim 1, wherein the initial sequence of measurements at one of the one or more measurement sites is different from the initial sequence of measurements at another of the one or more measurement sites.

4. The metrology system of claim 1, wherein the initial sequence of measurements at one of the one or more measurement sites is the same as the initial sequence of measurements at another of the one or more measurement sites.

5. The metrology system of claim 1, wherein the subset of the initial sequence of measurements associated with each of the one or more measurement sites is one measurement.

6. The metrology system of claim 1, wherein the determining the first updated sequence of measurements includes an optimization of measurement uncertainty, measurement time, move time, target dosage, or any combination thereof.

7. The metrology system of claim 1, wherein the illuminating the semiconductor structure at one measurement site occurs simultaneously with the determining of the first updated sequence of measurements at a second measurement site.

8. The metrology system of claim 1, wherein the determining of the first updated sequence of measurements at a first measurement site occurs before the illuminating of the semiconductor structure at a second measurement site.

9. A method comprising:
estimating an initial value of a parameter of interest characterizing a semiconductor structure disposed at one or more measurement sites;
determining an initial sequence of measurements of the semiconductor structure by a metrology system at each of the one or more measurement sites, wherein each measurement of the initial sequence of measurements is characterized by a different value of one or more metrology system parameters;
illuminating the semiconductor structure at each of the one or more measurement sites in accordance with each of a subset of the initial sequence of measurements associated with each of the one or more measurement sites, the subset of the initial sequence of measurements having fewer measurements than the initial sequence of measurements;
detecting a first amount of measurement data associated with the measurements of the subset of the initial sequence of measurements at each of the one or more measurement sites in response to the illumination;
estimating a first updated value of the parameter of interest characterizing the semiconductor structure at each of the one or more measurement sites based on the first amount of measurement data associated with each of the one or more measurement sites, wherein the estimating of the first updated value of the parameter of interest characterizing the semiconductor structure at one measurement site of the one or more measurement sites is based on the first amount of measurement data associated with the measurements at a plurality of the one or more measurement sites; and
determining a first updated sequence of measurements of the semiconductor structure by the metrology system at each of the one or more measurement sites based on the first amount of measurement data, wherein each measurement of the updated sequence of measurements is characterized by a different value of one or more metrology system parameters.

10. The method of claim 9, further comprising:
estimating a measurement uncertainty associated with an estimation of a value of the parameter of interest based on the first updated sequence of measurements of the semiconductor structure by the metrology system at each of the one or more measurement sites;
illuminating the semiconductor structure at each of the one or more measurement sites in accordance with each of a subset of the first updated sequence of measurements associated with each of the one or more measurement sites if the measurement uncertainty is less than a predetermined threshold value;
detecting a second amount of measurement data associated with each of the measurements of the subset of the first updated sequence of measurements at each of the one or more measurement sites in response to the illumination;
estimating a second updated value of the parameter of interest characterizing the semiconductor structure at each of the one or more measurement sites based on the second amount of measurement data; and
determining a second updated sequence of measurements of the semiconductor structure by the metrology system, wherein each measurement of the second updated sequence of measurements is characterized by a different value of one or more metrology system parameters.

11. The method of claim 9, wherein the initial sequence of measurements at one of the one or more measurement sites is different from the initial sequence of measurements at another of the one or more measurement sites.

12. The method of claim 9, wherein the initial sequence of measurements at one of the one or more measurement sites is the same as the initial sequence of measurements at another of the one or more measurement sites.

13. The method of claim 9, wherein the subset of the initial sequence of measurements associated with each of the one or more measurement sites is one measurement.

14. The method of claim 9, wherein the determining the first updated sequence of measurements includes an optimization of measurement uncertainty, measurement time, move time, target dosage, or any combination thereof.

15. The method of claim 9, wherein the illuminating the semiconductor structure at one measurement site occurs simultaneously with the determining of the first updated sequence of measurements at a second measurement site.

16. The method of claim 9, wherein the determining of the first updated sequence of measurements at a first measurement site occurs before the illuminating of the semiconductor structure at a second measurement site.

17. A metrology system comprising:
an x-ray illumination subsystem configured to illuminate a semiconductor structure with x-ray radiation at each of one or more measurement sites in accordance with each of a subset of an initial sequence of measurements associated with each of the one or more measurement sites, the subset of the initial sequence of measurements having fewer measurements than the initial sequence of measurements;
an x-ray detector configured to detect a first amount of measurement data associated with the measurements of the subset of the initial sequence of measurements at each of the one or more measurement sites in response to the illumination provided by the x-ray illumination subsystem; and
a non-transitory, computer-readable medium, comprising instructions that when executed by a computing system cause the computing system to:
estimate an initial value of a parameter of interest characterizing the semiconductor structure disposed at each of the one or more measurement sites;
determine the initial sequence of measurements of the semiconductor structure by the metrology system at each of the one or more measurement sites, wherein each measurement of the initial sequence of measurements is characterized by a different value of one or more metrology system parameters that define a configuration of the metrology system;
estimate a first updated value of the parameter of interest characterizing the semiconductor structure at each of the one or more measurement sites based on the first amount of measurement data associated with each of the one or more measurement sites, wherein the estimating of the first updated value of the parameter of interest characterizing the semiconductor structure at one measurement site of the one or more measurement sites is based on the first amount of measurement data associated with the measurements at a plurality of the one or more measurement sites; and
determine a first updated sequence of measurements of the semiconductor structure by the metrology system at each of the one or more measurement sites based on the first amount of measurement data, wherein each measurement of the updated sequence of measurements is characterized by a different value of one or more metrology system parameters.

18. The metrology system of claim 17, wherein the x-ray illumination subsystem illuminates the semiconductor structure with x-ray radiation at each of one or more measurement sites in accordance with each of a subset of the first updated sequence of measurements associated with each of the one or more measurement sites, wherein the x-ray detector detects a second amount of measurement data associated with the measurements of the subset of the first updated sequence of measurements at each of the one or more measurement sites in response to the illumination provided by the x-ray illumination subsystem; the non-transitory, computer-readable medium, further comprising instructions that when executed by a computing system cause the computing system to:

estimate a measurement uncertainty associated with an estimation of a value of the parameter of interest based on the first updated sequence of measurements of the semiconductor structure by the metrology system at each of the one or more measurement sites;

estimate a second updated value of the parameter of interest characterizing the semiconductor structure at each of the one or more measurement sites based on the second amount of measurement data; and determine a second updated sequence of measurements of the semiconductor structure by the metrology system, wherein each measurement of the second updated sequence of measurements is characterized by a different value of one or more metrology system parameters.

* * * * *